United States Patent
Leizerovich et al.

(12)

(10) Patent No.: US 6,194,975 B1
(45) Date of Patent: Feb. 27, 2001

(54) DUAL BAND VCO WITH IMPROVED PHASE NOISE

(75) Inventors: Gustavo D. Leizerovich, Aventura; Peter J. Yeh, Coral Springs, both of FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/460,058

(22) Filed: Dec. 13, 1999

(51) Int. Cl.[7] .............................. H03B 5/12; H04B 1/50
(52) U.S. Cl. ................ 331/117 R; 331/175; 331/177 V; 331/179; 331/185; 455/75; 455/256
(58) Field of Search .................... 331/117 R, 117 FE, 331/117 D, 167, 175, 177 V, 179, 185; 455/75, 86, 255, 256

(56) References Cited

U.S. PATENT DOCUMENTS

| | | | |
|---|---|---|---|
| 4,156,204 | 5/1979 | Hargis | 331/12 |
| 4,270,098 | 5/1981 | Bowman | 331/96 |
| 4,270,213 | 5/1981 | Falk et al. | 455/77 |
| 4,454,483 | 6/1984 | Baylor | 331/11 |
| 4,574,243 | 3/1986 | Levine | 328/155 |
| 4,590,602 | 5/1986 | Wolaver | 375/120 |
| 4,609,884 | 9/1986 | Kindinger et al. | 331/109 |
| 4,714,899 | 12/1987 | Kurtzman et al. | 331/1 A |
| 4,755,772 | * 7/1988 | Khanna | 331/109 |
| 4,764,737 | 8/1988 | Kaatz | 331/1 A |
| 4,975,650 | 12/1990 | Martin | 328/133 |
| 5,382,921 | 1/1995 | Estrada et al. | 331/1 A |
| 5,389,898 | 2/1995 | Taketoshi et al. | 331/2 |
| 5,604,465 | 2/1997 | Farabaugh | 331/10 |
| 5,686,864 | 11/1997 | Martin et al. | 331/1 A |

* cited by examiner

Primary Examiner—David Mis
(74) Attorney, Agent, or Firm—Barbara R. Doutre

(57) ABSTRACT

A dual band VCO selects between the oscillator output frequencies by switching the resonant circuit elements in the active circuit. For each output frequency selected, the oscillator produces a single frequency signal and additional energy in the form of phase noise. This phase noise may be from sideband noise produced by modulation of the single frequency or produced by the active device in the oscillator as flicker noise, or the noise figure of the active device under large signal conditions or the filtering effect or the resonant circuit. Phase noise is reduced by shifting the bias point for the active device to the level where phase noise is minimum for each output frequency. At the time the output frequency is selectively switched, the bias to the active device is selectively switched to an optimum bias level for minimum phase noise for each respective selected frequency.

15 Claims, 4 Drawing Sheets

US 6,194,975 B1

DUAL BAND VCO WITH IMPROVED PHASE NOISE

BACKGROUND OF THE INVENTION

1. Field of the Invention

This invention relates in general to voltage controlled oscillators (VCO's), and more particularly to reduction of phase noise in the frequency spectrum around a VCO signal frequency.

2. Description of the Prior Art

As is well known in the art, a dual band VCO selects between oscillator output frequencies by switching resonant circuit elements in the active circuit. For each output frequency selected, the oscillator produces a single frequency signal and additional energy in the form of phase noise. This additional sideband noise produced by modulation of the single frequency, is produced by the active device in the oscillator as flicker noise, or the noise figure of the active device under large signal conditions and the filtering effect or the resonant circuit. Achievement of good phase noise performance in each of the switched bands, by use of separate VCO's, has the disadvantage of requiring more components, weight, and cost. Phase noise, as it is known and understood by those skilled in the art, is discussed in 7.5 *Noise and Performance Analyses Using CAD Tools*, Communications Receivers. 2nd Edition, Ulrich L. Rohde, Jerry Whitaker and T. T. N. Bucher, which is published by McGraw Hill Company. However, changing the resonant elements without more, does not achieve optimum phase noise performance in a dual band VCO.

Therefore, there exists a need to resolve the problems with the prior art to significantly improve phase noise performance of a dual band VCO as discussed above.

SUMMARY OF THE INVENTION

The invention disclosed according to its inventive principles, achieves optimum phase noise performance in each of the VCO's switched bands output signal frequencies by controlling the bias applied to the active device in the oscillator circuit to a level producing the best phase noise performance for the respective output signal frequency. As shown in the preferred embodiment, the resonant circuit components are selectively switched to change the output signal frequency to a desired band. For each of the bands, the active device, such as a semiconductor device, for example a bipolar transistor, will have an optimum bias point where the phase noise is minimum. Altering the bias to the active device in the oscillator circuit is accomplished at the time the resonant circuit elements are selectively switched so the bias applied to the active device is the optimum bias for optimum phase noise performance and minimum phase noise at the respective output signal frequency selected. Phase noise may be from the flicker noise contribution of the active element in the oscillator circuit or the noise figure of the active device under large signal conditions or from the filtering effect of the resonant circuits or may be phase noise produced, for example, by oscillator amplitude variations producing sidebands on each side of the signal frequency.

Cellular telephones and radios operating in several modes are typically required to switch between receiving frequencies and transmitting frequencies. As would be apparent to one skilled in the art, the use of dual band VCO's for generating the signals needed for modulation and transmission of the base band signal or for demodulation and detection of the baseband signal is more complex than using separate VCO's to generate the same four frequencies, for example. One challenge presented when using a switchable dual band VCO is the achievement of optimum phase noise performance at each of the selected bands. Phase noise, for example, may be measured over frequency and time by measuring the spectral energy at frequencies about the signal frequency and over a set period of time. In this way the spectrum of undesired energy at in a frequency spectrum about the signal frequency may be determined.

A VCO which may be used according to the disclosed inventive principles, for example in a remote cellular phone or duplex radio, uses the same active circuit to generate the desired frequencies or bands. The variation of the bands is achieved, in the preferred embodiment, by selectively switching the resonant circuit components as needed to change the output frequency. For each of the output frequencies, there is a bias level for the active device, such as a semiconductor, for example, where the phase noise's performance is optimum. Accordingly, when the VCO components are switched, changing the resonant elements in the oscillator circuit to generate a separate distinct output signal frequency, the bias level is applied to the active device for which the phase noise performance is optimum for that separate respective output signal frequency. According to the principles of the invention, for the switchable VCO, there is a separate respective bias level for the oscillator active element, at which the phase noise performance is optimum for each respective output signal frequency.

Switching of the resonant elements to achieve a change in the VCO output signal frequency, may be by a diode or micro electronic switch, or semiconductor such as a bipolar transistor or field effect transistor (FET) or other solid state device or micro electromechanical switch or by an electromechanical switch or by other switch means as would be known and understood to those skilled in the art.

This invention is able to achieve those optimum bias levels matched to each of the output signal frequencies for optimum phase noise performance, as disclosed in the description of the preferred embodiment below, by applying a bias level for each output signal frequency at which the phase noise performance is optimum.

What is shown and described is a variable output frequency oscillator with the output signal frequency controlled in response to a band switch signal, having a variable output signal frequency oscillator with an active element and respective output signal frequencies, the active element having bias levels for optimum phase noise performance at the respective output signal frequencies; the variable output signal frequency oscillator including switched elements for producing the respective output signal frequencies and a switch coupled to said switched elements for switching said switched elements to produce the respective output signal frequencies in response to a band change signal, and a terminal coupled to said active element for applying respective bias level signals to the active element for optimum phase noise performance of the variable output signal frequency oscillator at the respective output signal frequencies.

DESCRIPTION OF A PREFERRED EMBODIMENT

The invention, according to its inventive principles, is disclosed with reference to the preferred embodiment, as described below.

Figure 1:
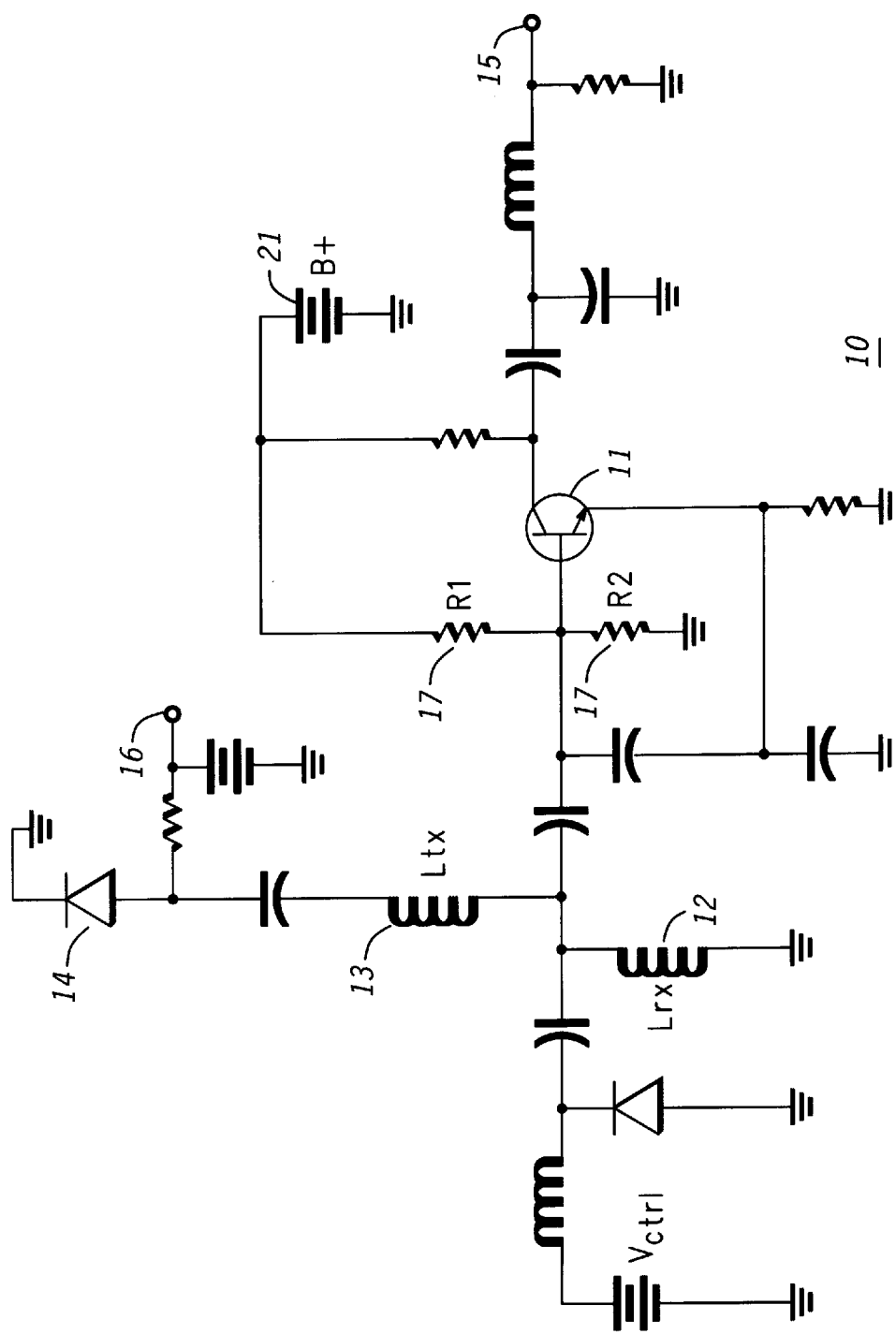
FIG. 1 shows, in a schematic form, a prior art VCO.

A prior art VCO is shown generally by numeral 10, with reference to FIG. 1. As shown for the prior art, a dual band VCO is switched between dual output signal frequencies at output terminal 15, by applying a band change signal at terminal 16 to switch 14. Switch 14 selectively connects or disconnects resonant element 13, to resonant element 12, to alter the output signal frequency of active element 11, as would be known to one skilled in the art. The bias to active element 11 is provided through resistive network 17 comprising resistors R1, R2.

Figure 2:
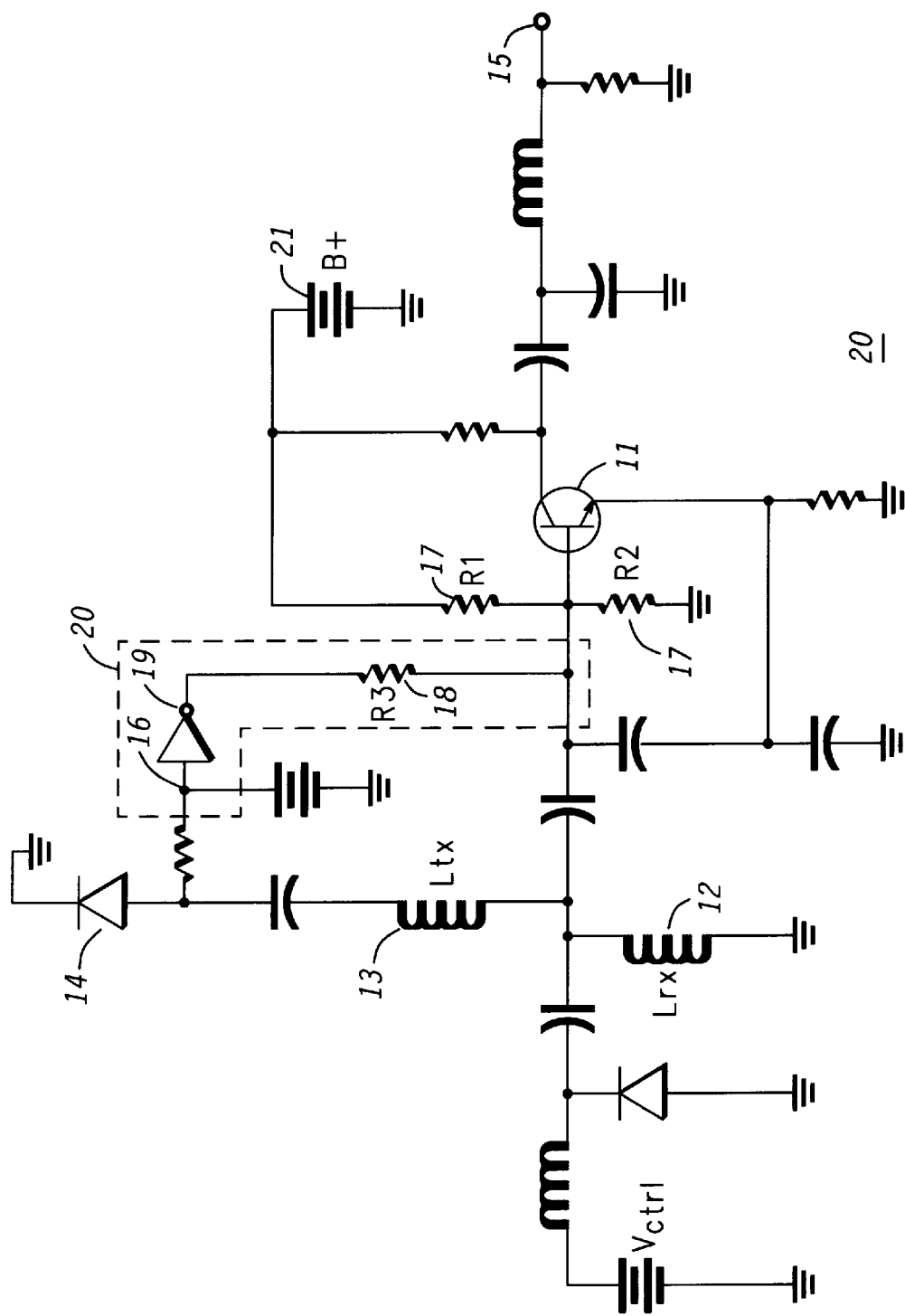
FIG. 2 shows, in a schematic form, a VCO according to the inventive principles.
Figure 3:
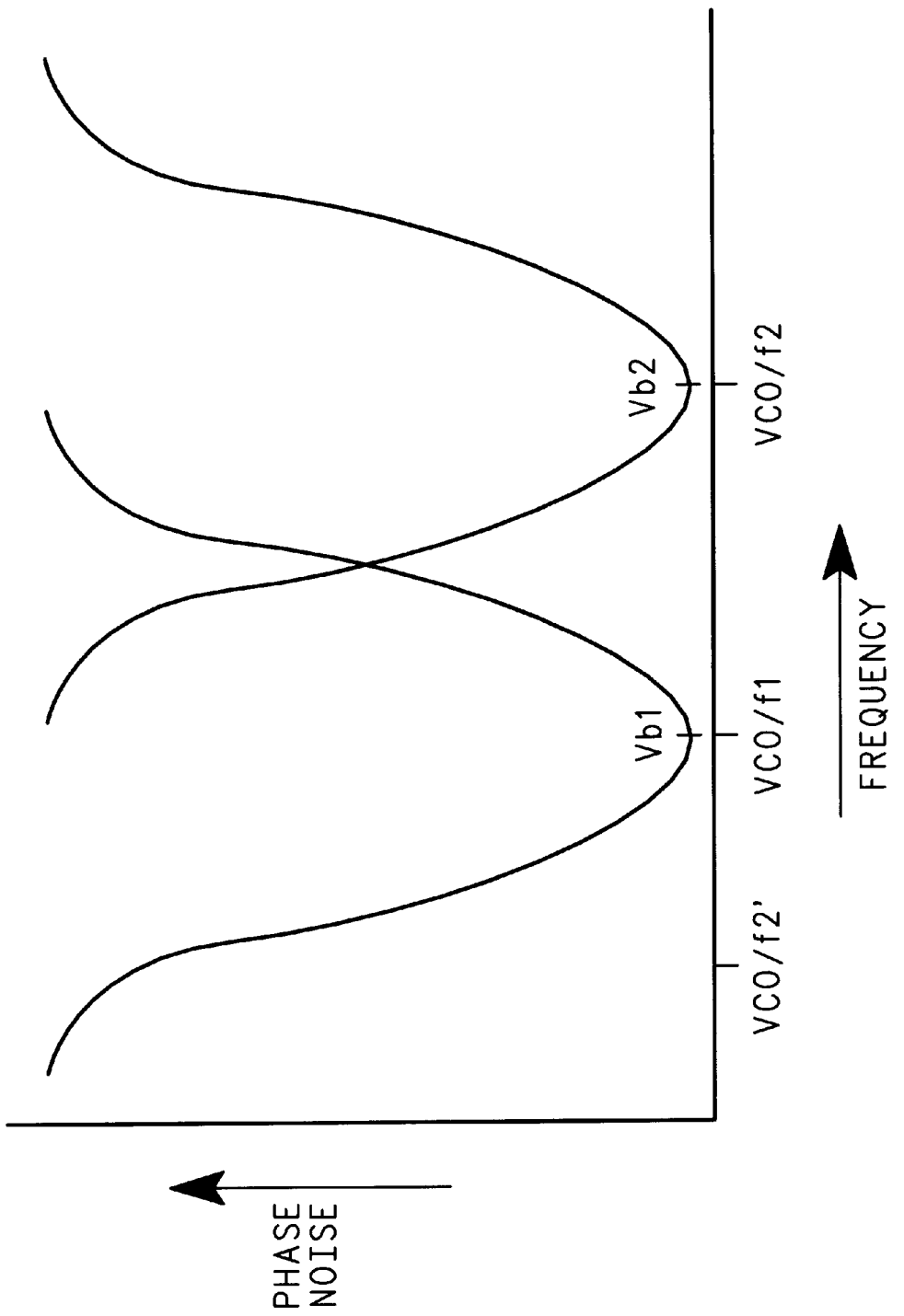
FIG. 3 is a representation of the Phase Noise compared to the output signal frequencies and the biasing of the active element of the VCO at which the Phase Noise performance is optimum.

The invention, according to the inventive principles is shown in FIG. 2, using the same numerals as used in FIG. 1 for the same parts. The VCO is shown generally by FIG. 2 by 20. Although a dual band VCO is shown with reference to the preferred embodiment, the invention is not limited by the number of VCO bands or separate frequencies. The structure and operation of a VCO are well known and understood by those skilled in the art and for that reason only those parts of the VCO required to explain the invention are described with reference to FIG. 2. The active element 11, is shown as a bipolar transistor and the invention may be used with any other semiconductor or non semiconductor element used for the active oscillator component, as would be known to those skilled the art. As shown, the bias applied to the active element is from B+ supply 21 through resistive network R1, R2, shown by numeral 17 and by the band switch signal applied to terminal 16 and through R3 shown by numeral 18. According to the inventive principles, the bias to the active device is changed when the resonant element is switched to change the output signal frequency, to a bias level for optimum phase noise performance at the switched output signal frequency. As shown in the dashed lines 20 of FIG. 2, resistor R3 is connected to the band switch signal applied to terminal 16. A voltage inverter, 19 also shown within the dashed lines 20, is shown as an example for the preferred embodiment and is not necessary to the practice of the invention. In response to a band switch signal in a first state at terminal 16, the resonant element 12 is connected to the active element 11. In first mode when the band switch signal is in a first state, the bias Vb1 to the active element 11, is applied through the voltage divider circuit R1, R2, R3 as would be well known to one skilled in the art. According to the inventive principles the band switch signal state may be at ground or a positive or negative signal with respect to ground. In the example shown for the preferred embodiment, the band switch signal in a first state may be at ground. Then the bias Vb1 applied by divider network R1, R2, R3, shown as numerals 17 and 18 respectively, is the bias level which produces the optimum phase noise response at output signal frequency VCO/f1. VCO/f1 is the output signal frequency when resonant element 12 is connected in the VCO oscillator circuit with active element 11. Referring to FIG. 3, the phase noise response is shown for a bias level Vb applied to the active element 11. As shown in FIG. 3, for the preferred embodiment, the phase noise is minimum for bias level Vb1 applied to active element 11, for the output signal frequency produced with resonant element 12. The selectively operated switch responsive to the band switch signal at terminal 16, shown as 14, is used to connect or disconnect resonant element 13 to alter the frequency of the output signal at VCO output terminal 15. For the preferred embodiment, the switch is shown as diode 14 operated by the band switch signal at terminal 16. The switch may be a solid state device such as a FET or a microelectronic switch or a non-solid state device as known to those skilled in the art. As shown for the preferred embodiment, the band switch signal applied at terminal 16 in a second state causes selectively operated switch 14 to connect resonant element 13 to the oscillator circuit of the VCO. At the same time, as shown for the preferred embodiment, the band switch signal at terminal 16 is applied to bias resistor R3, applying a bias to active element 11 to Vb2, through resistive network R1, R2, R3, as would be known to those skilled in the art. The element used to apply the band switch signal at terminal 16, as a bias signal through resistor R3 is shown in the preferred embodiment as an inverter 19 which may be required to reverse the voltage applied to the switch 14 depending on the polarity of the active element and the state of the band switch signal. In the example shown for the preferred embodiment, the active element is a NPN bipolar transistor. As would be apparent to one skilled in the art, various combinations of signals and switches may be used to apply the correct bias Vb to the active element for minimum phase noise at a respective chosen output signal frequency and the inverter 19 is shown by way of example only.

In the example shown, according to the inventive principles, the bias applied to active element 11, for example when the band switch signal is in a second state, and through R3 when resonant element 13 is connected to the oscillator circuit changing the output signal frequency to VCO/f2, is Vb2. When the band switch signal is in a first state, when resonant element 13 is disconnected, the bias applied to the active element 11 from the band switch signal applied through R3, is changed to Vb1, for respective output signal frequency VCO/f1. As will be recognized by those skilled in the art, sidebands may be produced when resonant elements are used to modify the output signal frequency, for example by adding resonant element 13, producing output signal frequency VCO/f2. For the active element, as shown for the preferred embodiment in FIG. 2, there is a bias level Vb' where the phase noise is minimal at the output signal frequency VCO/f, when a new resonant element is connected to the oscillator circuit. In the example shown for the preferred embodiment, according to the inventive principles, a change in the state of the band switch signal applied at terminal 16 causes the VCO output signal to change, for example to VCO/f2 from VCO/f1 by connecting a new resonant element 13 to the oscillator circuit and at the same time changes the bias level to the oscillator active element by applying that band switch signal through R3 of resistive network R1, R2, R3, as shown in the preferred embodiment, from Vb1, at which the level of phase noise is optimum for VCO/f1, to Vb2 at which the level of phase noise at optimum for VCO/f2 is optimum. The band switch signal is used to selectively connect resonant elements 13 with resonant element 12, changing the output signal frequency VCO/f and to bias the oscillator active element 11 through resistive network R1, R2, R3.

Figure 4:
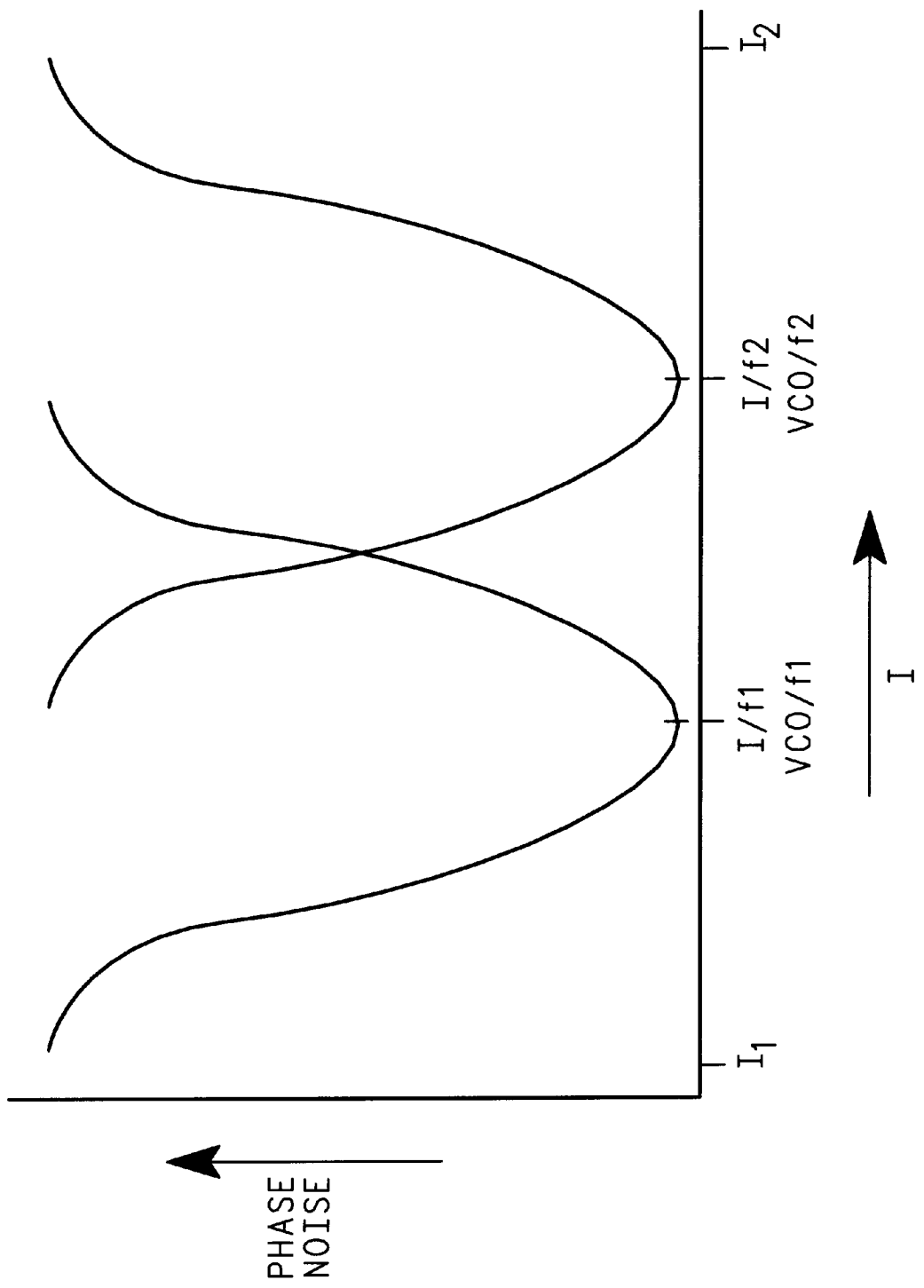
FIG. 4 is a representation of the Phase Noise compared to the bias current applied to the active element and the level of bias current and voltage at which the Phase Noise performance is optimum.

The active element, shown in the preferred embodiment as transistor, 11 will have an optimum bias point Vb1 for optimum phase noise performance, as shown for VCO output signal VCO/f1 and an optimum bias point Vb2 for optimum phase noise performance, as shown for VCO output signal VCO/f2, in FIG. 3. As shown in FIG. 4, as the bias current for active element 11, shown as base bias current I with active element 11 connected with a common emitter, is varied over the range I1 to I2, the phase noise decreases to a minimum, shown in FIG. 4 at I/f1. As shown in FIG. 4 for VCO output signal frequency VCO/f2, as the bias current to active device 11, I is varied, over the range I1 to I2, the phase noise decreases to a minimum, shown in FIG. 4 at I/f2. In operation, the bias levels to the active device, according to the principles of the invention, are set by applying to the active device the bias level for optimum phase noise performance The bias to the active element, shown as element 11 for example, may be set, as shown for the preferred embodiment, by the same signal as used to selectively connect or disconnect the resonant elements in or out of circuit by the switching means shown in the example of the preferred embodiment as diode 16. In this way, when the VCO band is switched by switching of resonant elements, to produce a separate respective output signal frequency at output terminal 15, the bias level to the active device 11, such as I/f1 for VCO/f1 or I/f2 for VCO/f2, for optimum phase noise performance at that separate respective output signal frequency is respectively applied to active device 11.

The phase noise of the output signals at VCO output terminal 15 may be measured over a frequency spectrum about the VCO output frequencies and over a period of time, for example by sweeping a spectrum analyzer over a range of said output frequencies. The manner of spectrum analysis is well known to those skilled in the art and not shown with reference to the preferred embodiment. As shown in FIG. 3, the phase noise in the output signal is shown over a frequency spectrum. For the output signal frequency VCO/f, phase noise is minimum for active circuit bias level Vb1 and for the output signal frequency VCO/f2, phase noise is minimum for active circuit bias level Vb2. As, in the preferred embodiment, sidebands such as VCO/f2' contributing to phase noise may occur when resonant elements such as element 13 is switched in or out of the VCO oscillator circuit.

As shown and described, an active element in a VCO, such as a semiconductor, may be biased at levels where the phase noise is minimum for respective VCO output signal frequencies. The bias level may be varied to the oscillator circuit active element for each VCO output signal frequency so output signal phase noise is minimized at each respective output signal frequency. The bias level may be controlled by a separate signal or combined with a band switch signal used to selectively switch the components controlling the VCO output signal frequencies so the bias level to the active element remains at the level for optimum phase noise at the respective output signal frequency.

Although specific embodiments of the invention have been disclosed, it will be understood by those having skill in the art that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A variable output frequency oscillator with the output signal frequency controlled in response to a band switch signal, comprising:

a variable output signal frequency oscillator with an active element and respective output signal frequencies; said active element having bias levels for optimum phase noise performance at said respective output signal frequencies;

said variable output signal frequency oscillator including switched elements for producing said respective output signal frequencies and a switch coupled to said switched elements for switching said switched elements to produce said respective output signal frequencies in response to a band change signal; and a terminal coupled to said active element for applying respective bias level signals to said active element for said optimum phase noise performance of said variable output signal frequency oscillator at said respective output signal frequencies.

2. The variable output frequency oscillator of claim 1, wherein said switch is a diode, a transistor, a field effect transistor (FET), an electromechanical switch or micro electric mechanical switch.

3. The variable output frequency oscillator of claim 1, wherein, said terminal is coupled to said switch for applying said respective bias level signals to said active element and said band change signal to said switch, simultaneously.

4. The variable output frequency oscillator of claim 1, wherein, said switched elements are resonant elements, and said switch is connected to said resonant elements for connecting said resonant elements to said active element for producing said respective output signal frequencies and said terminal is coupled to said switch for applying said band change signal to said switch.

5. The variable output frequency oscillator of claim 1, wherein said respective bias levels are applied responsive to said band change signal.

6. The variable output frequency oscillator of claim 5, wherein said band change signal applies said respective bias levels to said active element simultaneously with the band change signal applied to said switch for switching said switched elements to produce said respective output signal frequencies for said respective bias levels.

7. A portable cellular or duplex radio system, using variable frequency oscillators to switch between separate respective output signal frequencies in response to a band switch signal, when transmitting or receiving, comprising:

a variable output signal frequency oscillator with an active element and respective output signal frequencies;

said variable output signal frequency oscillator including a switched elements for producing said respective output signal frequencies and a switch coupled to said switched elements for switching said output signal between said respective output signal frequencies in response to said band switch signal; and a terminal coupled to said active element for applying respective bias level signals to said active element for optimum phase noise performance of said variable output signal frequency oscillator at said respective output signal frequencies.

8. The portable cellular or duplex radio system of claim 7, wherein said switch is a diode, a transistor, a field effect transistor (FET), an electromechanical switch or micro electric mechanical switch.

9. The portable cellular or duplex radio system of claim 7, wherein, said switch in a first state, S1, connects said switched elements to produce a first output signal frequency, VCO/f1, and a first bias level, Vb1, to said active element at which the phase noise performance of said variable signal frequency oscillator is minimum for output signal, VCO/f1, and said switch in a second state, S2, connects said switched elements to produce a second output signal frequency, VCO/f2, and a first bias level, Vb2, to said active element at which the phase noise of said variable output signal frequency oscillator is minimum for output signal, VCO/f2.

10. The portable cellular or duplex radio system of claim 7, wherein, said terminal is coupled to said switch and to said active element for applying a band change signal to said switch to switch said switched elements and to said active element to apply said respective bias level signals to said active element.

11. The portable cellular or duplex radio system of claim 7, wherein, said switched elements are resonant elements, and said switch is connected to said resonant elements and said terminal is coupled to said active element for applying said respective bias level to said active element for optimum phase noise performance at said respective output signal frequencies.

12. The portable cellular or duplex radio system of claim 7, wherein said switched elements are resonant elements and said switch is a non-linear device for connecting or disconnecting said switched elements and changing the output signal frequency to said respective output signal frequencies.

13. A method for biasing an active element of a variable output frequency oscillator with a switched element for producing separate respective output signal frequencies, for optimum phase noise performance at said separate respective output signal frequencies, comprising the steps of:

using a band switch signal for biasing said active element at a first bias level at which the phase noise performance of said variable output frequency oscillator at a first output signal frequency is optimum; and using said band switch signal to switch said switched element to produce a second output signal frequency and to bias said active element at a second bias level at which the phase noise performance of said variable output frequency oscillator at said second output signal frequency is optimum.

14. The method of claim 13, including the step of applying said band switch signal and said respective bias level to a terminal coupled to said active device and to said switch.

15. The method of claim 13, including the step of using a diode, a transistor, a field effect transistor (FET), an electromechanical switch or a micro electric mechanical switch, to switch said switched element to produce a second output signal frequency.

* * * * *